US012512420B2

(12) United States Patent
Carrier et al.

(10) Patent No.: US 12,512,420 B2
(45) Date of Patent: Dec. 30, 2025

(54) ELECTRONIC MODULE FOR CHIP CARD (71) Applicant: SMART PACKAGING SOLUTIONS, Rousset (FR)

(72) Inventors: Cécile Carrier, Rousset (FR); Maxime Di Bernardo, Rousset (FR); Kevin Fabrizio, Rousset (FR)

(73) Assignee: SMART PACKAGING SOLUTIONS, Rousset (FR)

( * ) Notice: Subject to any disclaimer, the term of this patent is extended or adjusted under 35 U.S.C. 154(b) by 616 days.

(21) Appl. No.: 17/905,372

(22) PCT Filed: Mar. 25, 2021

(86) PCT No.: PCT/EP2021/057753
§ 371 (c)(1),
(2) Date: Aug. 31, 2022

(87) PCT Pub. No.: WO2021/198018
PCT Pub. Date: Oct. 7, 2021

(65) Prior Publication Data
US 2023/0123983 A1  Apr. 20, 2023

(30) Foreign Application Priority Data
Mar. 30, 2020 (FR) ....................................... 2003101

(51) Int. Cl.
*H01L 23/00* (2006.01)
*G06K 19/07* (2006.01)
(Continued)

(52) U.S. Cl.
CPC ........ *H01L 23/573* (2013.01); *G06K 19/0723* (2013.01); *H01L 23/49855* (2013.01);
(Continued)

(58) Field of Classification Search
CPC ....................................................... H01L 23/57
See application file for complete search history.

(56) References Cited

U.S. PATENT DOCUMENTS

2011/0090658 A1* 4/2011 Adams ................. H01L 23/573
427/7
2019/0355674 A1* 11/2019 Farison .................. H01L 24/48

FOREIGN PATENT DOCUMENTS

EP 1628244 A1 2/2006
JP 2003150924 A 5/2003
(Continued)

OTHER PUBLICATIONS

International Searching Authority, International Search Report (ISR) and Written Opinion received for Application No. PCT/EP2021/057753, dated Jun. 29, 2021, 11 pages, European Patent Office, Netherlands.
(Continued)

*Primary Examiner* — Yu-Hsi D Sun
(74) *Attorney, Agent, or Firm* — ALSTON & BIRD LLP (57) ABSTRACT

The invention relates to an electronic module (30) intended to be held in place on a carrier (1) by a holding means (4), the electronic module (30) consisting of a plurality of layers, comprising a first carrier layer (10) carrying one or more contacts (11), a first face (10b) of the carrier layer (10) is in contact with a first face (12a; 53a) of a substrate (12; 53) and comprising a face of the substrate (12b; 53b) carrying one or more antennas (13; 50, 51), the antenna(s) (13; 50, 51) being connected to an integrated circuit (14) via feeder links (15). The electronic module (30) comprises at least one stay-in-place safety layer (31) arranged between the first carrier layer (10) and the substrate (12), the safety layer (31) being an adhesive layer, the safety layer (31) having technical features such that the binding forces Fad1 of the layer are lower than the binding forces Fad2 of the holding means (4)
(Continued)

so as to cause the rupture of the feeder links (15) by the action of a tensile force exerted on the electronic module.

12 Claims, 5 Drawing Sheets

(51) Int. Cl.
*H01L 23/498* (2006.01)
*H01L 23/31* (2006.01)

(52) U.S. Cl.
CPC .......... *H01L 23/3121* (2013.01); *H01L 24/45* (2013.01); *H01L 24/48* (2013.01); *H01L 2224/45124* (2013.01); *H01L 2224/45139* (2013.01); *H01L 2224/45144* (2013.01); *H01L 2224/45147* (2013.01); *H01L 2224/48227* (2013.01)

(56) References Cited

FOREIGN PATENT DOCUMENTS

| JP | 2005301554 A | 10/2005 |
| JP | 2015184715 A | 10/2015 |

OTHER PUBLICATIONS

National Institute of Industrial Property, Preliminary Search Report and Written Opinion received for Application No. FR2003101, dated Dec. 2, 2020, 6 pages, Republic of France.

\* cited by examiner

ELECTRONIC MODULE FOR CHIP CARD

CROSS REFERENCE TO RELATED APPLICATIONS

This application is a national stage application, filed under 35 U.S.C. § 371, of International Application No. PCT/EP2021/057753, filed Mar. 25, 2021, which claims priority to French Application No. FR2003101, filed Mar. 30, 2020, the contents of both of which as are hereby incorporated by reference in their entirety.

The invention relates to an electronic module intended, in particular, to be integrated into a portable object such as a dual chip card comprising, for data exchange, a contact function and a contactless function.

The electronic module according to the invention may be integrated into any device using inductive coupling technology to carry out transactions or, more generally, data exchanges.

The electronic module according to the invention may be integrated into any portable device, such as a card, used in the fields of identification, transport, banking, access control, health, and also in the field of telecommunications.

By virtue of inductive coupling technology, it is possible, with a little experience or technical means, to cleanly lift an electronic module from the cavity in which it is located without negatively affecting its operation, or more generally to separate the electronic module from a support. The electronic module may then be installed in another card, for fraudulent use of the data contained in this electronic module by a person who is not the cardholder.

Figure 1:
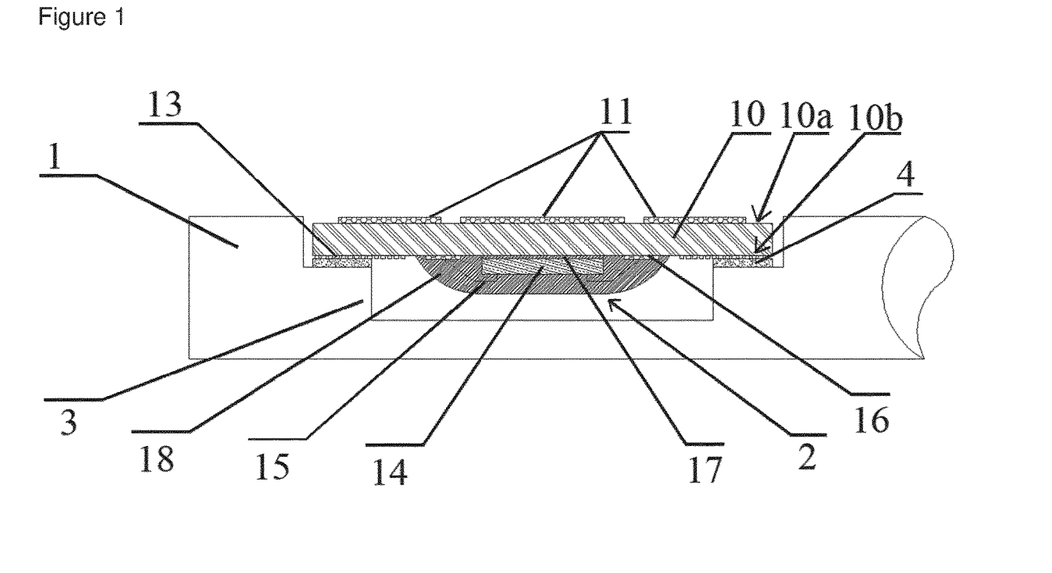
FIG. 1 is a view of a card comprising an electronic module.

FIG. 1 illustrates an example of a contactless chip card 1 comprising an electronic module 2. The electronic module 2 is positioned in a cavity 3 of the card and held in place by an inlaying adhesive 4.

In this example, the electronic module consists of a superposition of multiple layers, comprising a layer 10 supporting the contacts 11 on a first face 10a. On the second face 10b of the support layer are arranged one or more turns forming an antenna 13 allowing the inductive coupling. The antenna 13 is connected to a chip 14 via bonding wires 15, according to a technique known to those skilled in the art. The bonding wires 15 are linked by a second end to the contacts 11 of the upper face of the electronic module positioned in the card via bonding wells or openings 16. The chip is held in place by an adhesive or any other holding means 17. The assembly is protected by an encapsulation resin 18 which protects the chip and the connections.

Figure 2:
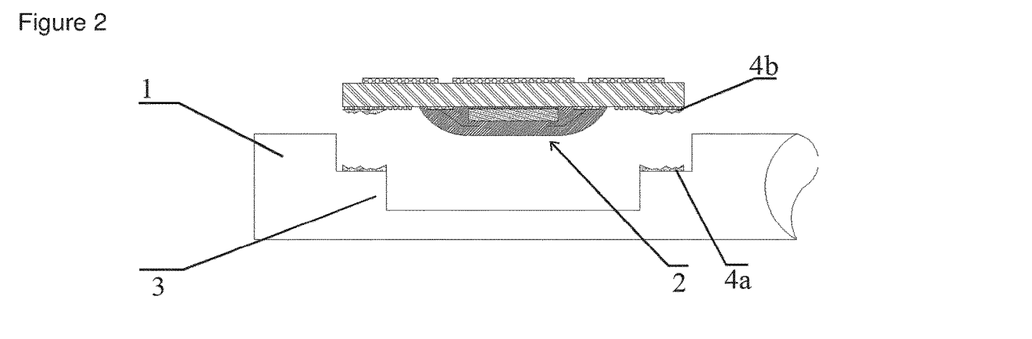
FIG. 2 is a view of the card of FIG. 1 after lifting of the electronic module with the module retaining its functionality.

FIG. 2 illustrates the result following lifting of the electronic module. In the figure, it is noted that only the inlaying adhesive is damaged, one portion 4a remaining on the card and another portion 4b on the module, the functionality of the electronic module being preserved, its connections not having been damaged or destroyed.

The concept of the present invention is to provide a new electronic module that has, in particular, the following feature: during a separation of the electronic module from its support, for example by "lifting", this separation will bring about "breakage" or delamination of the inner layers of the electronic module leading to breakage of the connections with the module antenna and/or of all the connections with the electronic module, or even damage to the structure of the antenna itself. For this, the electronic module will comprise at least one adhesive layer according to the invention which has specific characteristics and which will be referred to as the "adhesive security layer" to differentiate it from the adhesive layers used in the electronic module for other functions.

In the rest of the description, the expression "holding layer" will be used to designate a material such as an adhesive layer used to hold the electronic module in place on a support or in a cavity of a card, the expression "adhesive security layer" or "security layer" will be used to designate the layer used to bond the support layer bearing the contacts and the substrate layer bearing the antennas, and the expression "bonding adhesive" will be used to designate a layer used to hold an antenna on a substrate.

The invention relates to an electronic module intended to be held in place on a support by a holding means, said electronic module being made up of multiple layers, comprising a first support layer bearing one or more contacts, a first face of the support layer being in contact with a first face of a substrate and comprising a face of the substrate bearing one or more antennas, said one or more antennas being connected to an integrated circuit via connecting links. The electronic module comprises at least one security holding layer arranged between the first support layer and the substrate, said security layer being an adhesive layer, said security layer having technical characteristics such that the bond strengths $F_{ad1}$ of this layer are lower than the bond strengths $F_{ad2}$ of the holding means in order to bring about breakage of the connecting links under the effect of a tensile force exerted on the electronic module.

According to one embodiment, the support is a card and said electronic module is intended to be inserted into a cavity of said card.

According to one embodiment, the substrate comprises, on a first face comprising a first adhesive layer, a first antenna and, on a second face comprising a second adhesive layer, a second antenna, the two antennas are connected using an electrical crimp connection, and the bond strengths $F_{ad3}$ associated with the adhesive layers are lower than the bond strengths $F_{ad1}$ of the security holding layer.

The security holding layer is, for example, chosen from the list of the following families: a pressure-sensitive adhesive such as acrylics, silicones.

The security holding layer may be chosen from the following list: a thermoplastic, such as a copolyamide, phenolics or polyurethane.

The security holding layer may also be chosen from among thermosets such as copolyamides, phenolics, polyurethane.

The substrate is made, for example, of a material chosen from the list of the following materials: polyimide PI, polyethylene naphthalate PEN, polyethylene terephthalate PET, glass-epoxy, polyvinyl chloride PVC and polycarbonate PC.

The material of the security holding layer comprises epoxy polymers coupled with silicones and/or acrylics and in that the material of the holding means comprises phenolics and/or copolyamides.

By virtue of this combination of materials between the security holding layer and the material of the holding means, the elongation strength of this security holding layer is improved while ensuring that the bond strengths $F_{ad1}$ of this layer are lower than the bond strengths $F_{ad2}$ of the holding means so as to bring about breakage of the connecting links under the effect of a tensile force exerted on the electronic module.

The integrated circuit may be an electronic chip.

The integrated circuit and at least one antenna are protected by an encapsulation resin.

Thus, in the event of separation of the electronic module (lifting), a portion of the encapsulation resin will remain bonded to the integrated circuit and the antenna. If a malicious party wished to reuse this integrated circuit or this antenna in order to reconnect them to another medium, they would have to perform an operation to clean away this resin, such as an acid attack. This makes the practice of lifting even less attractive.

The invention also relates to a method for manufacturing an electronic module according to the invention, characterized in that it comprises at least the following steps:

using a support layer bearing one or more contacts on a first face, producing a multilayer or complex by placing a second face of the support layer in contact with a first face of a substrate with a security holding layer exhibiting a bond strength $F_{ad1}$ lower than the bond strength $F_{ad2}$ of the material used to hold said electronic module in place on a support so that, under the effect of a tensile force exerted on the electronic module, breakage of the connecting links is brought about, bonding an integrated circuit to the second face of the layer of the support, electrically connecting at least one antenna present on the second layer of the substrate and the contact support to one or more pads of the integrated circuit using connecting links, protecting the assembly consisting of at least the integrated circuit, the substrate and at least the antenna.

The method may comprise a step in which a first adhesive layer is deposited in order to hold in place a first antenna arranged on the first face of the substrate and a second adhesive layer is deposited in order to hold in place the second antenna arranged on the second face of the substrate, the adhesive layers each having a bond strength $F_{ad3}$ that is lower than or equal to bond strength $F_{ad1}$.

Other features, details and advantages of the invention will become apparent from reading the description given with reference to the appended drawings, which are given by way of non-limiting example and which show, respectively.

In order to clearly understand the structure of the electronic module according to the invention, the following example is given for a dual card that has a contact function and a contactless function and comprises an electronic module or chip.

Figure 3:
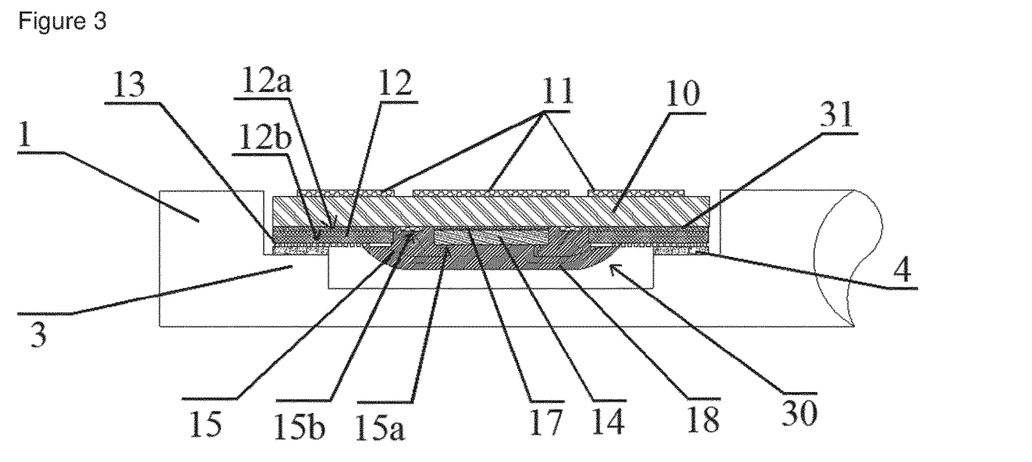
FIG. 3 is a view of a card comprising an electronic module according to the invention.

FIG. 3 illustrates an example of an electronic module according to the invention. The electronic module 30 is positioned in a cavity 3 of a chip card 1 according to techniques known to those skilled in the art and held in place by means of an inlaying adhesive 4.

In this example, the electronic module consists of a superposition of multiple layers, comprising a layer 10 supporting the contacts 11 (for reading by a card reader which is not shown for the sake of simplicity) on a first face 10a. A second face 10b of the support layer is in contact with a first face 12a of a substrate 12. On the second face of the substrate 12b are arranged one or more turns forming an antenna 13 allowing the inductive coupling. The antenna 13 is connected to an integrated circuit, such as an electronic chip 14, via a first end 15a of bonding wires 15, according to a technique known to those skilled in the art. The bonding wires 15 are linked by a second end to the contacts 11 of the upper face of the electronic module positioned in the card via bonding wells or openings 16. The electronic chip is held in place by an adhesive or any other holding means 17. The assembly is protected by an encapsulation resin 18, for example, which protects the chip and the connections.

In addition to these elements, the electronic module comprises an adhesive security layer 31 which, in the example, is placed between the inner face 10b of the support layer 10 (second face 10b) bearing the contacts 11 and the face 12a of the substrate 12 bearing the antenna 3.

The characteristics of the material forming the adhesive security layer are chosen in particular according to the material used for the inlaying adhesive. Its physico-chemical characteristics are chosen such that when an attempt is made to remove the electronic module from the card, the "pull" exerted to separate the electronic module from its support (or the extraction thereof from the cavity of the card) first causes damage to the adhesive security layer, as illustrated in FIGS. 4, 5, 7 and 8.

The bonds with this adhesive layer will break before the bonds provided by the inlaying adhesive, for example. In other words, there will be a break in the connections necessary for the proper functioning of the electronic module. The adhesion forces are shown schematically in FIG. 4 (lower part of the figure).

With reference to bond strengths that ensure maximum adhesion or at least sufficient adhesion to hold the various elements in place:

$F_{ad1}$ designates the bond strength allowing the material forming the adhesive security layer to hold the electronic module in place on a support, $F_{ad2}$ designates the bond strength ensuring that the electronic module is held together with the card, held in the cavity of the card, or on a support.

The characteristics of the adhesive security layer are such that the bond strength $F_{ad1}$ is lower than the bond strength $F_{ad2}$. In this way, when a person tries to remove the electronic module from its location, the adhesive security layer will yield first, which will have a negative effect on the operation of the electronic module.

The adhesive material constituting this adhesive security layer will be chosen, for example, from the list of the following families of adhesives: pressure-sensitive adhesives (PSAs), thermoplastics and thermosets. Among pressure-sensitive adhesives, mention may be made of acrylics, silicones or polyethylene terephthalates (PETs). Among thermoplastics are copolyamide, phenolics, polyurethane. Among thermosets, it is possible to use epoxy bases or polyurethanes, or any other material having a similar function. The list of materials is given for illustrative purposes, is in no way limiting and any material that has properties making it possible to produce the adhesive security layer may be used without departing from the scope of the invention.

Figure 4:
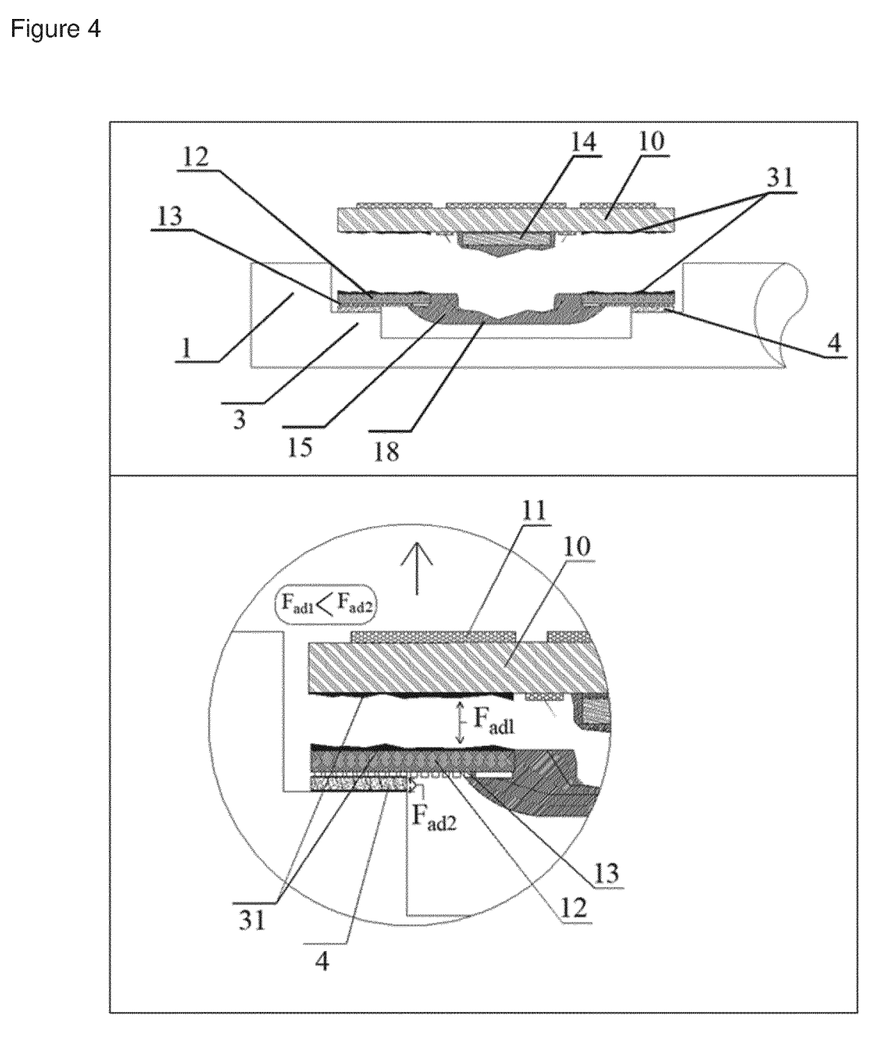
FIG. 4 is a view of the result following the lifting of the electronic module according to the invention.

FIG. 4 illustrates the result of a "forced lifting" of the electronic module according to the invention. The bonding wires linking the chip and the contacts are broken, with one portion of the bonding wires remaining attached to the chip and another portion attached to the contacts.

Figure 5:
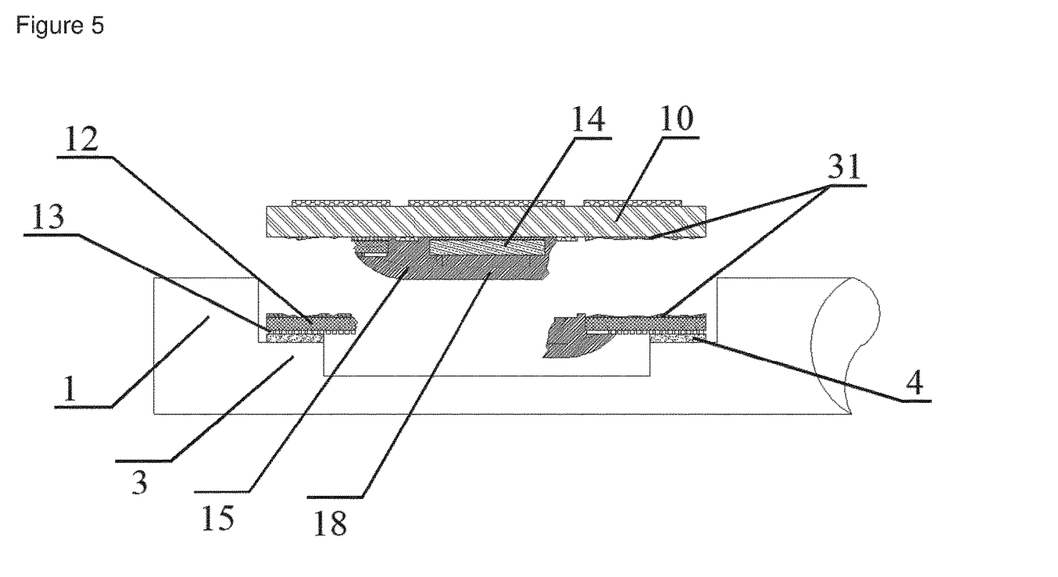
FIG. 5 is an illustration of the damage following lifting of the electronic module.

FIG. 5 illustrates another mode of damage in which there is breakage of the encapsulation layer.

Figure 6:
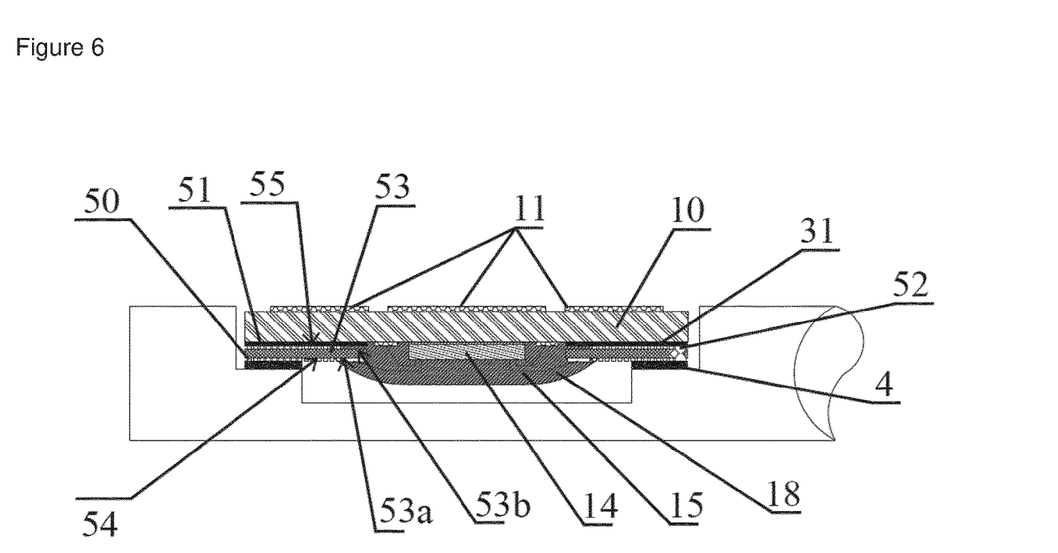
FIG. 6 is an example of an electronic module according to the invention with dual antenna.

FIG. 6 illustrates another embodiment of the electronic module comprising a double-sided antenna.

According to another embodiment, the electronic module according to the invention may comprise a substrate comprising a double-sided antenna on each face.

Those elements of the module which are identical to those of FIG. 3 bear the same references.

A first antenna 50 is deposited on a first surface 53a of the substrate, and a second antenna 51 is deposited on a second surface 53b of the substrate 53. The two antennas are connected by an electrical connection by crimping between jaws with force and ultrasound, known as a crimp 52. In this structure, a bonding adhesive 54, 55 is used to hold each of the antennas in place on one face of the substrate. The bond strengths associated with the adhesive layers 54, 55 (bonding adhesive), $F_{ad3}$ are lower than or equal to the bond strengths $F_{ad1}$ with the security adhesive (antenna/contact tape), (lower part of FIG. 9), which are themselves lower than the bond strengths $F_{ad2}$ of the inlaying adhesive (hotmelt: module/support).

Figure 7:
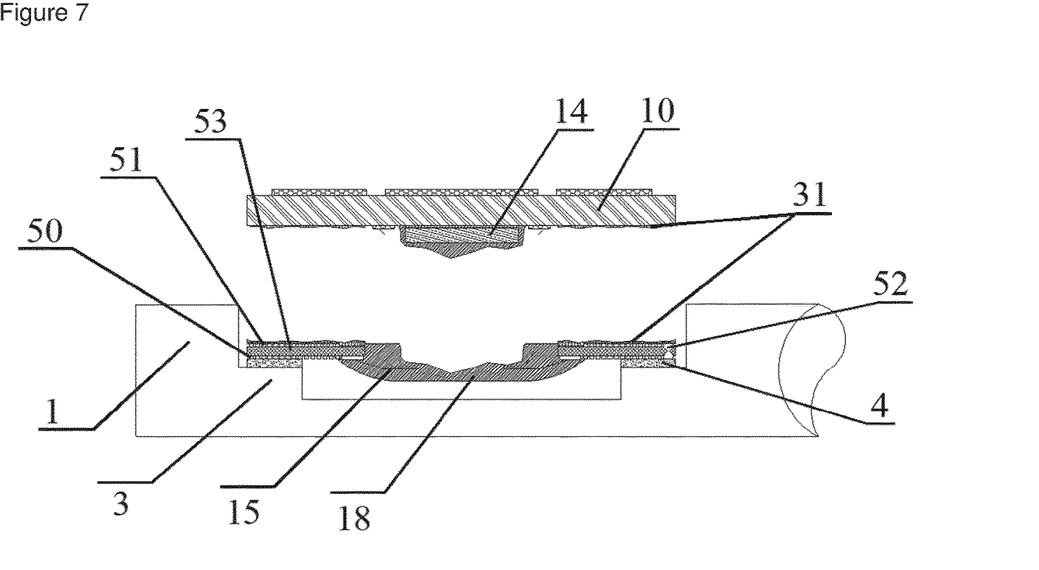
FIG. 7 is a first example of damage to the electronic module following its forced removal from the card.

FIG. 7 illustrates the breakage in the connections during a forced lifting of the electronic module: the chip 14 remains on the support 10, one portion of the security layer 31 remains on the support, another portion remains on the substrate and the connections between the chip and the antenna are broken.

Figure 8:
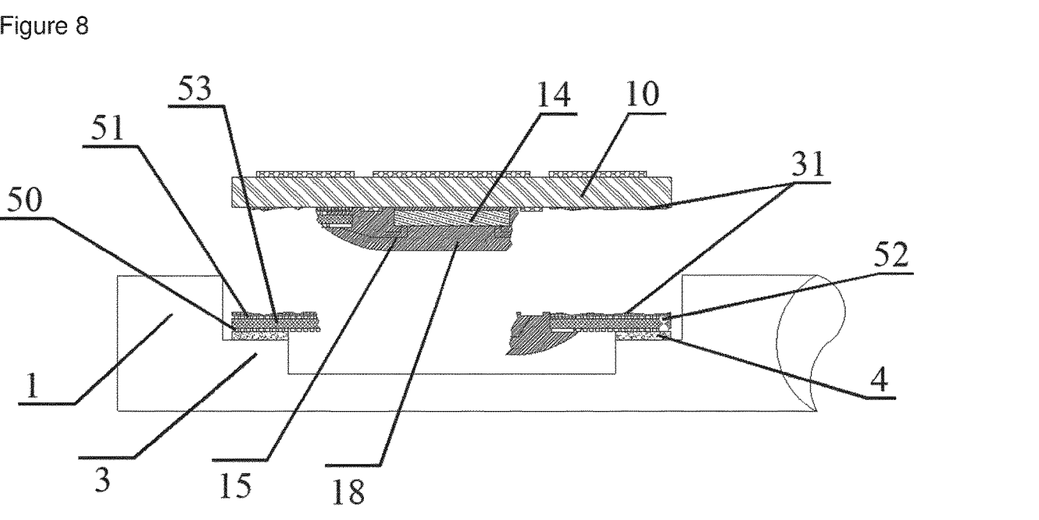
FIG. 8 is a second illustration of the damage to the electronic module following its removal from the card.
Figure 9:
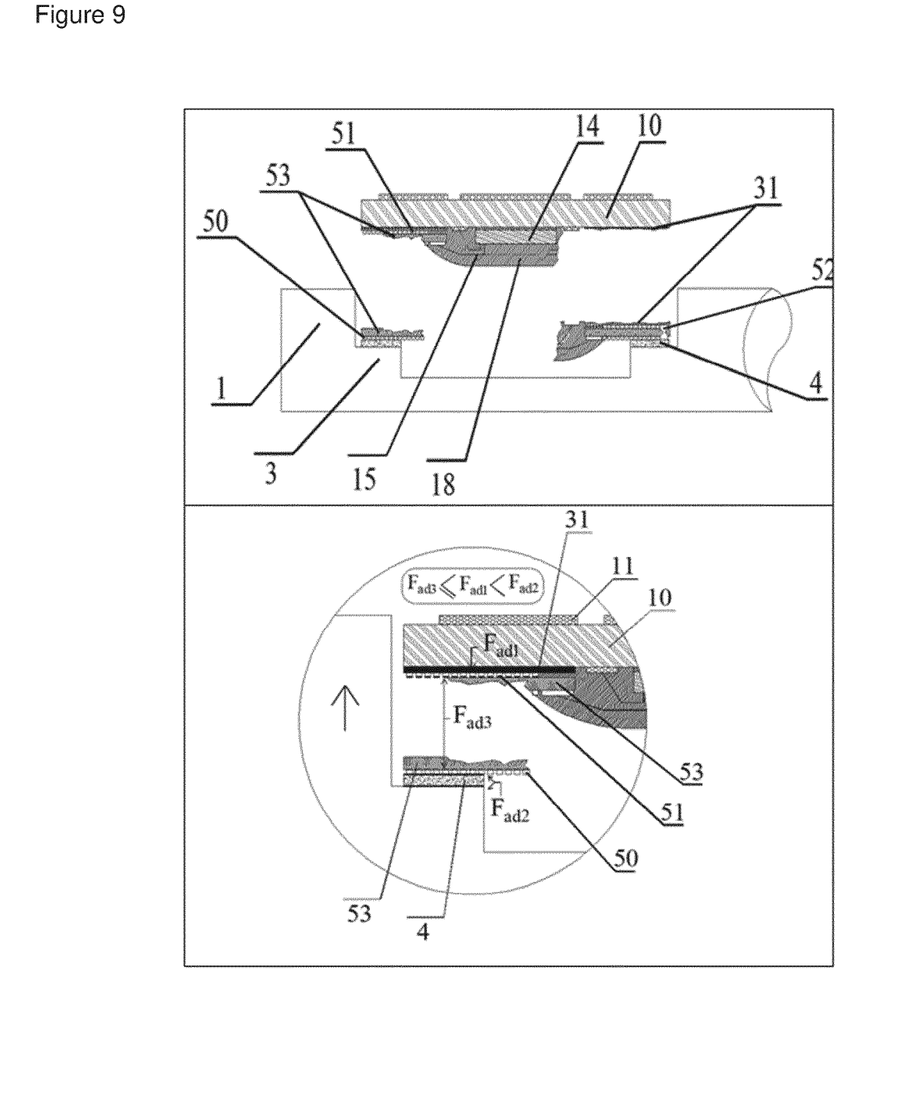
FIG. 9 is a third example of damage to the structure of the electronic module.

FIG. 8 illustrates the damage observed for the electronic module with the substrate remaining on the inlaying adhesive, and FIG. 9 illustrates another type of damage where it is observed that the substrate 53 has separated, with one portion remaining on the inlaying adhesive and another portion remaining on the support 10.

According to one mode of manufacturing the module, the layer bearing the supports and the substrate bearing the antenna will be laminated together, the adhesive security layer thus being laminated. This will ensure a better hold over time for the various layers.

The material used to make the antenna may be chosen from the following list: gold, aluminum, or any other electrically conductive metal material exhibiting equivalent properties. The adhesive material will be chosen so as to be compatible with the material of the antenna in order to secure the film in contact with the substrate bearing the antenna.

The antenna will be produced, for example, using techniques known to those skilled in the art, for example an etching technique, or an additive method, a method where the surface of the desired pattern is activated to allow the growth or direct transfer of the conductor, by screen printing or transfer, for example.

The substrate is, for example, a layer consisting of a rigid material or of a material that endows it with flexibility. It may be chosen from the following list of materials: polyimide PI, polyethylene naphthalate PEN, polyethylene terephthalate PET, glass-epoxy or polyvinyl chloride PVC. The material chosen will be compatible with the additional adhesive.

According to one variant embodiment, the chip may be bonded directly or positioned according to the "flip-chip" technique.

The electronic module may be manufactured using techniques known to those skilled in the art.

For example, the method for manufacturing the module according to the invention may comprise at least the following steps:

using a support layer 10 bearing contacts 11 on a first face 10a.

producing a multilayer or complex by arranging the second face 10b of the support layer in contact with a first face 12a of the substrate 12 with an adhesive security layer exhibiting a bond strength $F_{ad1}$ that is lower than the bond strength $F_{ad2}$ of the material that will be used to hold the module in place in a cavity of the final card.

bonding an electronic chip 14 to the complexed face 10b using a standard bonding method or the flip-chip technique.

In the case of an electronic chip bonded using standard bonding (not flip-chip), electrically connecting at least one antenna 13 present on the second layer 12b of the substrate 12 and the contact support 11 to one or more pads for the electronics 14 (or integrated circuit) using bonding wires using bonding wires made of gold, copper, silver, aluminum or any other precious or semi-precious material used in the technical field of wire bonding.

protecting the assembly with a protective resin or any other material that has a similar function.

In the case of a double antenna, as shown in FIG. 6, the method will further comprise a step in which an adhesive layer 54, 55 is deposited in order to hold in place a first antenna 50 and a second antenna 51 arranged on each face 53a, 53b of the substrate 53.

The functionality of the electronic module according to the invention will be negatively affected, or even destroyed, following "lifting" or separation of the electronic module from the support with which it is associated. The module will be separated at its inner layers, bringing about breakage of the connections to the module antenna and potentially of all those connected to the chip.

The invention claimed is:

1. An electronic module (30) intended to be held in place on a support (1) by a holding means (4), said electronic module (30) being made up of multiple layers, comprising:
   a first support layer (10) bearing one or more contacts (11), a first face (10b) of the support layer (10) being in contact with a first face (12a; 53a) of a substrate (12; 53);
   one face of the substrate (12b; 53b) bearing one or more antennas (13; 50, 51), said one or more antennas (13; 50, 51) being connected to an integrated circuit (14) via connecting links (15)
   characterized in that said electronic module (30) comprises at least one security holding layer (31) arranged between the first support layer (10) and the substrate (12), said security layer (31) being an adhesive layer, said security layer (31) having technical characteristics such that the bond strengths Fad1 of this layer are lower than the bond strengths Fad2 of the holding means (4) in order to bring about breakage of the connecting links (15) under the effect of a tensile force exerted on the electronic module.

2. The electronic module (30) as claimed in claim 1, characterized in that the support (1) is a card and said electronic module (30) is intended to be inserted into a cavity (3) of said card (1).

3. The electronic module as claimed in claim 1, characterized in that the substrate (53) comprises, on a first face (53*a*) comprising a bonding adhesive (54), a first antenna (50) and, on a second face (53*b*) comprising a bonding adhesive (55), a second antenna (51), the two antennas being connected using an electrical crimp connection (52), and in that the bond strengths Fad3 associated with the bonding adhesives (54, 55) are lower than or equal to the bond strengths Fad1 of the security layer (31).

4. The electronic module as claimed in claim 1, characterized in that the material of the security holding layer (31) is chosen from the list of the following families: a pressure-sensitive adhesive such as acrylics, silicones.

5. The electronic module as claimed in claim 1, characterized in that the material of the security holding layer is a thermoplastic, such as a copolyamide, phenolics or polyurethane.

6. The electronic module as claimed in claim 1, characterized in that the material of the security holding layer is chosen from the following list: thermosets such as copolyamides, phenolics, polyurethane.

7. The electronic module as claimed in claim 1, characterized in that the substrate is made of a material chosen from the list of the following materials: polyimide PI, polyethylene naphthalate PEN, polyethylene terephthalate PET, glass-epoxy, polyvinyl chloride PVC and polycarbonate PC.

8. The electronic module as claimed in claim 2, characterized in that the material of the security holding layer (31) comprises epoxy polymers coupled with silicones and/or acrylics and in that the material of the holding means (4) comprises phenolics and/or copolyamides.

9. The electronic module as claimed in claim 1, characterized in that the integrated circuit (14) is an electronic chip.

10. The electronic module as claimed in claim 1, characterized in that the integrated circuit (14) and at least one antenna (13; 50, 51) are protected by an encapsulation resin (18).

11. A method for manufacturing an electronic module, characterized in that it comprises at least the following steps:
    using a support layer (10) bearing one or more contacts (11) on a first face (10*a*);
    producing a multilayer or complex by placing a second face (10*b*) of the support layer (10) in contact with a first face (12*a*; 53*a*) of a substrate (12; 53) with a security holding layer (31),
    bonding an integrated circuit (14) to the second face (10*b*);
    electrically connecting at least one antenna (13; 51) present on the second face (12*b*; 53*b*) of the substrate (12; 53) and the contact support (11) to one or more pads of the integrated circuit (14) using connecting links (15), wherein the security holding layer (31) exhibits a bond strength Fad1 lower than the bond strength Fad2 of the material used to hold said electronic module in place on a support so that, under the effect of a tensile force exerted on the electronic module, breakage of connecting links (15) connecting the at least one antenna (13; 51) and integrated circuit (14) is brought about;
    protecting the assembly consisting of at least the integrated circuit, the substrate and at least the antenna (13; 51).

12. The method as claimed in claim 11, characterized in that it comprises a step of depositing an adhesive layer (54, 55) to hold in place a first antenna (50) placed on the first face (53*a*) of the substrate (53) and the second antenna (51) arranged on the second face (53*b*) of the substrate (53).

* * * * *